United States Patent
Oetting et al.

(10) Patent No.: US 10,356,534 B2
(45) Date of Patent: Jul. 16, 2019

(54) APPARATUS AND METHOD FOR CONTROLLING THE DYNAMIC COMPRESSOR AND METHOD FOR DETERMINING AMPLIFICATION VALUES FOR A DYNAMIC COMPRESSOR

(71) Applicants: Fraunhofer-Gesellschaft zur Foerderung der angewandten Forschung e.V., Munich (DE); Carl von Ossietzky Universitaet Oldenburg, Oldenburg (DE)

(72) Inventors: Dirk Oetting, Oldenburg (DE); Volker Hohmann, Oldenburg (DE); Stephan D Ewert, Oldenburg (DE); Jens Ekkehart Appell, Achternmeer (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/690,980

(22) Filed: Aug. 30, 2017

(65) Prior Publication Data
US 2017/0366904 A1 Dec. 21, 2017

Related U.S. Application Data

(63) Continuation of application No. PCT/EP2016/054328, filed on Mar. 1, 2016.

(30) Foreign Application Priority Data

Mar. 4, 2015 (DE) ........................ 10 2015 203 855

(51) Int. Cl.
*H04R 25/00* (2006.01)
*H03G 9/02* (2006.01)

(52) U.S. Cl.
CPC ........... *H04R 25/356* (2013.01); *H03G 9/025* (2013.01); *H04R 25/505* (2013.01);
(Continued)

(58) Field of Classification Search
None
See application file for complete search history.

(56) References Cited

U.S. PATENT DOCUMENTS

2008/0253593 A1* 10/2008 Bramslow ............. H03G 9/025
381/312
2008/0253595 A1 10/2008 Steinbuss
(Continued)

FOREIGN PATENT DOCUMENTS

DE 10 2007 017 761 A1 10/2008
JP 1997284898 A 10/1997
(Continued)

OTHER PUBLICATIONS

Brand, T., "Loudness Scaling", 8th EFAS Congress / 10th Congress of the German Society of Audiology, (CD-ROM), Jun. 6-9, 2007, pp. 1-7.
(Continued)

*Primary Examiner* — Qin Zhu
(74) *Attorney, Agent, or Firm* — Perkins Coie LLP; Michael A. Glenn

(57) ABSTRACT

An apparatus for controlling a dynamic compressor of a hearing aid includes a combination signal analyzer for determining the binaural similarity of a left and right audio signal and an amplification adjuster for providing an amplification value for a band of the left or right audio signal in dependence on the binaural similarity and a level of the left or right audio signal in the band.

12 Claims, 10 Drawing Sheets

(52) U.S. Cl.
CPC ........... *H04R 25/552* (2013.01); *H04R 25/70* (2013.01); *H04S 2420/07* (2013.01)

(56) References Cited

U.S. PATENT DOCUMENTS

| | | | |
|---|---|---|---|
| 2009/0110220 A1* | 4/2009 | Hain | H04S 3/004 381/309 |
| 2011/0249823 A1 | 10/2011 | Thomsen et al. | |
| 2012/0148054 A1* | 6/2012 | Rank | H04R 25/552 381/23.1 |
| 2013/0010972 A1* | 1/2013 | Ma | H04R 25/356 381/23.1 |
| 2013/0202119 A1* | 8/2013 | Thiede | A61B 5/0482 381/23.1 |
| 2013/0223634 A1* | 8/2013 | Rieger | H04R 25/50 381/23.1 |
| 2014/0050341 A1* | 2/2014 | Flynn | H04R 25/606 381/326 |
| 2014/0270190 A1* | 9/2014 | Flynn | H04R 25/552 381/23.1 |
| 2015/0049876 A1* | 2/2015 | Kim | H04R 25/70 381/60 |

FOREIGN PATENT DOCUMENTS

| | | |
|---|---|---|
| JP | 2005286876 A | 10/2005 |
| JP | 2014030248 A | 2/2014 |

OTHER PUBLICATIONS

Chen, Z. et al., "CHENFIT-AMP, A Nonlinear Fitting and Amplification Strategy for Cochlear Hearing Loss", IEEE Transactions on Bio-Medical Engineering, Jul. 2013, pp. 1-12.

Kiessling, J. et al., "Adaptive Fitting of Hearing Instruments by Category Loudness Scaling (ScalAdapt)", Int.J.Audiol., vol. 25(3), 1996, pp. 153-160.

Kollmeier, B. et al., "Real-time multiband dynamic compression and noise reduction for binaural hearing aids", J. Rehabil. Res. and Dev., vol. 30(1), 1993, pp. 82-94.

Moore, B.C.J. et al., "Measurement and modeling of binaural loudness summation for hearing-impaired listeners", J.Acoust.Soc. Am., vol. 136(2), Jun. 2014, pp. 736-747.

Oetting, D. et al., "Model-based loudness compensation for broad- and narrow-band signals", Proceedings of the International Symposium on Auditory and Audiological Research (ISAAR), Dec. 2013, pp. 365-372.

Oetting, D. et al., "Model-based loudness compensation for broad- and narrow-band signals", (abstract), ISAAR, 2013, p. 121.

Oetting, D. et al., "Spectral and binaural loudness summation for hearing-impaired listeners", Hearing Research, vol. 335, Mar. 19, 2016, pp. 179-192.

Strelcyk, O. et al., "Restoration of loudness summation and differential loudness growth in hearing-impaired listeners", J.Acoust.Soc. Am., vol. 132 (4), Oct. 2012, pp. 2557-2568.

* cited by examiner

APPARATUS AND METHOD FOR CONTROLLING THE DYNAMIC COMPRESSOR AND METHOD FOR DETERMINING AMPLIFICATION VALUES FOR A DYNAMIC COMPRESSOR

CROSS-REFERENCE TO RELATED APPLICATIONS

This application is a continuation of copending International Application No. PCT/EP2016/054328, filed Mar. 1, 2016, which claims priority from German Application No. 10 2015 203 855.6, filed Mar. 4, 2015, wherein each is incorporated herein in its entirety by this reference thereto.

The present invention relates to audio signal processing and in particular to audio signal processing in connection with hearing aids.

BACKGROUND OF THE INVENTION

Individual loudness sensation is very important when fitting or adapting hearing aids. Hearing loss is typically described by the audiogram and includes the levels of the just perceivable sounds (hearing threshold level, HTL), between typically 125 Hz and 8 KHz and the levels of the sounds that lead to an uncomfortably high loudness sensation (uncomfortable loudness level, UCL). Low-level sounds have to be amplified for the hearing-impaired person so that the same become audible again. However, hearing-impaired persons typically have similar levels for the uncomfortable loudness level as persons with normal hearing. This phenomenon is called recruitment. This means that the amplification has to be significantly reduced for high-level signals in order to make the same not "too loud" for the hearing-impaired person. In current hearing aids, this level and frequency-dependent amplification is performed by multi-band dynamic compressors. The same split the input signal in different frequency bands, measure the current level in each frequency band and in that way the same can calculate and apply the desired amplification. One goal when adapting the amplification values to the individual hearing is the substantial normalization of loudness perception. However, narrowband loudness compensation in each frequency channel frequently results in a loudness in broadband and broadband binaural signals that is perceived as being too high. Thus, there is the technical problem that no loudness compensation can be obtained for narrow and broadband signals with a multiband dynamic compressor having independent amplification regulation in the frequency bands, since a further distinction of the signal type has to be made for applying the correct amplification values. Different opinions exist on the relevance of this problem, which are supported by different studies. However, there are significant empirical indications that current hearing aid adjustments in day-to-day hearing situations are perceived as too loud at high ambient levels. It is the object of the present invention to solve this specific problem in a practical manner.

Today, fitting of a multiband dynamic compressor to the individual hearing loss is typically performed based on a prescriptive fitting formula, which includes the audiogram as input parameter. Loudness-based methods increase the measurement effort for the initial fitting, since loudness scaling has to be performed in addition to the audiogram. So far, loudness-based methods could not establish themselves with respect to threshold-based descriptive fittings in daily clinical practice, since the measurable advantage in fitting is only limited and hence no time is saved during fine tuning. The current standard for fitting hearing aids are audiogram-based regulations such as NAL-NL2, DSL [i/o] or manufacturer-specific fitting rules, such as ConexxFit by Siemens. These threshold-based fitting rules are typically configured for optimizing speech comprehensibility and recovery of loudness of broadband signals (NAL-NL1 speech signal) and additionally include empirical correction factors (NAL-NL2 amplification reduction, since NAL-NL1 tended to be evaluated as being too loud). In loudness-compensating methods, an attempt has been made to recover the narrow-band loudness functions or to normalize loudness of speech. After the initial fitting, fine-tuning is performed by the hearing aid audiologist in order to adjust the device to the individual loudness sensation and the subjective preference, typically for broadband signals. A possible algorithm using the bandwidth and the level of a signal, respectively, for applying different amplification values for narrowband and broadband signals is described in [2]. The question remains how an algorithm can be adjusted for different signal types (e.g. narrowband and broadband). A possible solution is the usage of loudness models for signal-dependent regulation of the amplification in multiband dynamic compressors, such as described in [2]. A disadvantage when using a generalized loudness model are estimation errors in individual loudness evaluation of narrowband and broadband signals that are considerable, in particular in the aided condition.

It is a specific disadvantage of hearing aid adjustments that the same are not suitable for all situations. One reason for this is that adjustments are typically not made for monaural signals.

In other words, this means that a dynamic compressor within a hearing aid for an individual who will use the hearing aid will be adjusted first, e.g., for the left ear and then for the right ear. Even when the adjustments are made such that the same fit equally for narrowband and broadband signals, it has become clear that these adjustments are still too loud, e.g. for binaural signal types. If, however, the amplification values are reduced in order to obtain, if possible, comfortable loudness for such signals, other signals would again be too low.

This causes the problem that hearing aid adjustment works relatively well for specific signal types but is not suitable for other signal types which is due to the non-linearity of human hearing on the one hand and due to the many different types of hearing impairments on the other hand.

SUMMARY

According to an embodiment, an apparatus for controlling a first dynamic compressor in a first right hearing aid with a first amplification value and a second dynamic compressor in a second left hearing aid with a second amplification value may have: a combination signal analyzer for determining a binaural similarity between a right audio signal and a left audio signal; and an amplification adjuster for providing the first amplification value for the right audio signal in dependence on the binaural similarity and a level of the right audio signal and for providing the second amplification value for the left audio signal in dependence on the binaural similarity and a level of the left audio signal, wherein the amplification adjuster is configured to adjust the first amplification value for the first dynamic compressor and the second amplification value for the second dynamic compressor, at the same level and with high binaural similarity, to a respectively smaller value than in the case of low binaural similarity.

According to another embodiment, a method for controlling a first dynamic compressor in a first right hearing aid with a first amplification value and a second dynamic compressor in a second left hearing aid with a second amplification value may have the steps of: determining a binaural similarity between the right audio signal and the left audio signal; and providing a first amplification value for a band of the right audio signal in dependence on the binaural similarity and the level of the right audio signal in the band; and providing the second amplification value for the left audio signal in dependence on the binaural similarity and a level of the left audio signal, wherein the first amplification value for the first dynamic compressor and the second amplification value for the second dynamic compressor are adjusted, at the same level and with high binaural similarity, to a respectively smaller value than in the case of low binaural similarity.

According to another embodiment, a method for determining amplification values for a first dynamic processor and a second dynamic processor may have the steps of: adjusting the first dynamic compressor for a left channel and the second dynamic compressor for a right channel with a channel amplification function for monaural audio signals; determining a modified channel amplification function for the first dynamic compressor and the second dynamic compressor for binaural audio signals in the right channel and in the left channel; and applying the channel amplification function for monaural audio signals and applying the modified channel amplification function for binaural signals.

Another embodiment may have a non-transitory digital storage medium having a computer program stored thereon to perform the method for controlling a first dynamic compressor in a first right hearing aid with a first amplification value and a second dynamic compressor in a second left hearing aid with a second amplification value, the method having the steps of: determining a binaural similarity between the right audio signal and the left audio signal; and providing a first amplification value for a band of the right audio signal in dependence on the binaural similarity and the level of the right audio signal in the band; and providing the second amplification value for the left audio signal in dependence on the binaural similarity and a level of the left audio signal, wherein the first amplification value for the first dynamic compressor and the second amplification value for the second dynamic compressor are adjusted, at the same level and with high binaural similarity, to a respectively smaller value than in the case of low binaural similarity, when said computer program is run by a computer.

Another embodiment may have a non-transitory digital storage medium having a computer program stored thereon to perform the method for determining amplification values for a first dynamic processor and a second dynamic processor, the method having the steps of: adjusting the first dynamic compressor for a left channel and the second dynamic compressor for a right channel with a channel amplification function for monaural audio signals; determining a modified channel amplification function for the first dynamic compressor and the second dynamic compressor for binaural audio signals in the right channel and in the left channel; and applying the channel amplification function for monaural audio signals and applying the modified channel amplification function for binaural signals, when said computer program is run by a computer.

An apparatus for controlling a dynamic compressor of a hearing aid includes a combination signal analyzer for determining a similarity between the left and right audio signal for obtaining binaural similarity. Further, an amplification adjuster is provided for providing an amplification value for a band of the left or right audio signal in dependence on the binaural similarity and a level of the left or right audio signal within the band.

The combination signal analyzer can be controlled, for example, manually by a user or can operate as analyzer for analyzing the left and right channel actually as regards to its binaurality.

The amplification adjuster is configured to consider binaural loudness summation. Thus, it has been found out that adjusting hearing aids based on narrowband monaural test signals results in a loudness sensation for the individual carrying the hearing aid that is too loud and hence intolerable, in particular for high-level broadband signals. In other words, the individual perceives broadband binaural signals as being too loud. If, however, adjustment is performed such that broadband binaural signals are used for adjustment, monaural signals such as, for example, during a telephone conversation, are too low for the individual.

Above that, it has turned out that this effect of binaural loudness summation occurs in particular in broadband signals, such as speech signals, and above that in signals having average to high levels in the relevant bands. On the other hand, in narrowband signals and/or in signals having average or low levels, the effect is not so distinct, such that there exists a smaller difference between the binaural and the monaural adjustment, such that the adjustment for monaural signals or binaural signals is suited quite well for the respective other class of signals.

Preferred embodiments relate to an algorithm and a method for improving hearing aid adjustment. In particular, one embodiment relates to a multiband dynamic compressor and an adjustment of the same such that the amplification in each frequency band can be controlled additionally by one or several regulation parameters that are parameterized by analyzing the input signal and their classification in different classes of signals. In particular, the binaurality of the audio signal is determined and the amplification values for the individual bands are determined based on the binaurality of the signal. Further regulation parameters are the bandwidth of a signal, i.e., the ratio of the overall energy to the respective band energy, the ratio of signal to masking level of the adjacent bands, the number of non-masked bands, the width of the distribution of the signal energy in auditory bands, etc. which is used in addition to the binaurality of the signal (monaural: only on one ear; binaural: the same signal on both ears). In one embodiment, the amplification in the multiband compressor is adjusted first for the first class of signals, for example for monaural signals and the loudness sensation is now measured with these adjustments for the other class of signals, i.e. for binaural signals, and the results are applied as correction parameters or modification parameters within the algorithm for obtaining a predetermined loudness target function. An algorithm adapted in that manner results in a loudness compensation for both classes of signals and, as a consequence, to an adjustment for further desired classes of signals.

Preferred embodiments of the present invention result in a more efficient and improved amplification adjustment of a compressor for compensating the altered loudness sensation for hearing-impaired persons for narrowband and broadband signals by directly measuring the aided condition of the broadband loudness perception, in particular for binaural signals.

When wearing a hearing aid or hearing instrument adjusted in that manner, low narrowband signals, e.g. the signal sound of a washing machine are perceived as being sufficiently loud, but loud broadband signals, for example traffic noise, i.e. binaural broadband signals are also not perceived as being too loud.

Above that, the adjustment effort can be reduced, such that despite increased diagnostic effort for performing loudness scaling, all in all, a time advantage remains.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
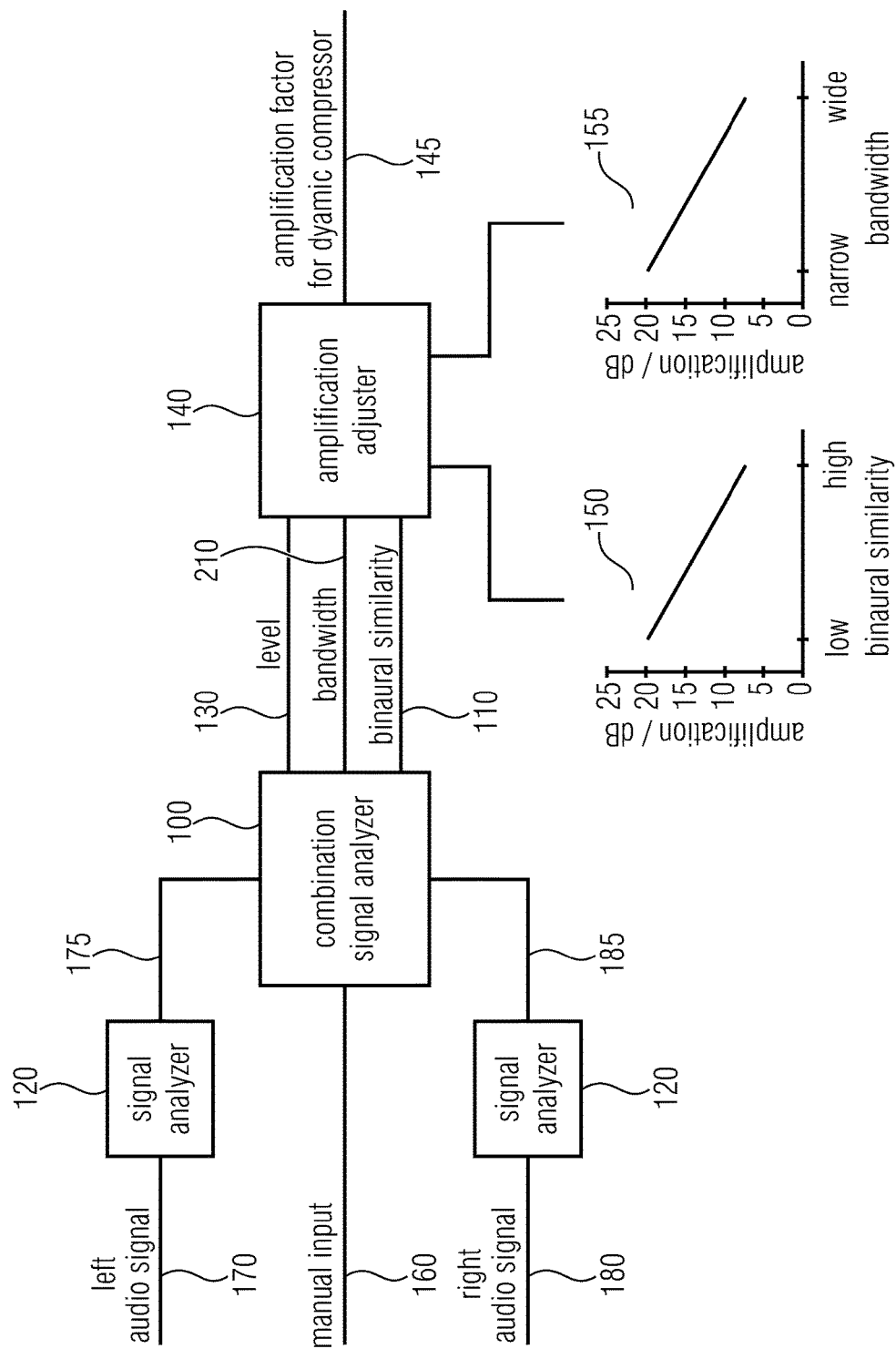
FIG. 1 is a block diagram of an apparatus for controlling a dynamic compressor.

FIG. 1 shows a block diagram of an apparatus for controlling a dynamic compressor not shown in FIG. 1 receiving amplification factors 145 from the output of an amplification adjuster 140. The apparatus for controlling the dynamic compressor typically arranged within a hearing aid includes a combination signal analyzer 100 for determining a similarity of the left audio signal 170 with the right audio signal 118 in order to obtain a binaural similarity 110. The binaural similarity 110 is fed into the amplification adjuster in order to provide an amplification value for the left or right audio signal in dependence on the binaural similarity 110. Further, the amplification value depends on a level 130 of the left or right audio signal, wherein the level 130 is provided by a signal analyzer 120 obtaining the left audio signal 170 and/or the right audio signal 180 to provide the level result 130. Alternatively, the level can also be provided by the combination signal analyzer 100 that receives, as input parameters, signal characteristics of the left 175 and right 185 audio signals as shown in FIG. 1.

In particular, the amplification adjuster 140 is configured to provide a smaller amplification factor 145 for the audio signal at a high binaural similarity 110 compared to the amplification factor provided for a low binaural similarity 110 at the same level 130.

This means that, for binaural signals, at the same level, a smaller amplification signal is used than for non-binaural and monaural signals, respectively. This is summarized in the diagram 150 in that the amplification adjuster 140 provides a comparatively small amplification factor for signals having the same level with high binaural similarity 110, while a greater amplification factor is used for the same level with low binaural similarity.

For level measurement, the signal analyzer 120 includes a filter bank, such as an FFT filter bank having the same bandwidths or an aurally compensated filter bank, i.e. a Bark filter bank where the bands become broader towards higher frequencies. This filter bank is used to split the left and right audio signals into a plurality of bands in order to determine the respective level within each band. These levels are transmitted to the combination signal analyzer 100 as signal characteristic for the left signal 175 and the right signal 185. Further signal characteristics that can be determined by means of the signal analyzer 120 are, among others, the bandwidth of the signal, the signal level, a description of the spectral distribution and the time behavior of the level change. The signal characteristics serve to describe the input signal as precisely as possible in order to be able to calculate, in the combination signal analyzer 100, the signal parameters essential for loudness compensation and hence to determine the needed amplification factors 145 by the amplification adjuster 140. When wearing hearing aids, signal characteristics are transmitted via a wireless interface from the left device to the right device. Transmission of the entire input signal would involve a high data rate and high current consumption which is to be avoided here. That way, only mandatory signal characteristics describing the signal are to be transmitted at a low data rate. During implementation in headphones where a wired interface exists between the right and left channel, the signal analyzer can also forward the input signal to the combination signal analyzer in an unamended manner, such that the entire analysis of the right and left channel as regards to the levels 130, the bandwidth 210 and the binaural similarity 110 takes place in the combination signal analyzer 100.

Further, in one embodiment, the combination signal analyzer is configured as actual combination signal analyzer for analyzing the left and right audio signal with regard to the bandwidth, wherein the amplification adjuster is configured to adjust the amplification factor for the band in dependence on whether the left or right audio signals are narrowband or broadband.

In an embodiment, with the same binaural similarity and the same level, a lower amplification value 145 is used for a broadband signal than for a narrowband signal 155. This considers the situation that the binaural loudness summation, in particular in broadband signals and not so much in narrowband signals is increased for hearing-impaired persons, and hence an erroneous situation occurs, in particular in a narrowband adjustment of the hearing aid and broadband signals in real life outside a test situation.

Here, it should be noted that an amplification value can actually relate to a positive amplification or also a negative amplification, i.e. attenuation. If an amplification value is, for example, an amplification factor, an amplification factor greater than 1 provides an actual amplification, while an amplification factor less than 1 provides a respective attenuation, i.e. a negative amplification.

Figure 2:
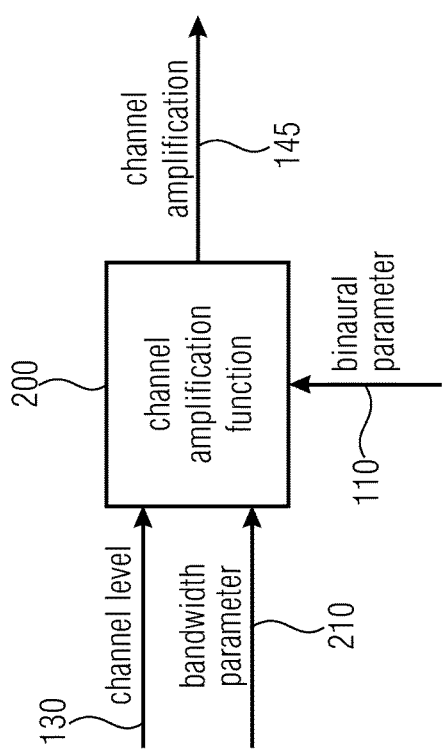
FIG. 2 is a schematic illustration of a channel amplification function providing channel amplification based on the binaural similarity, the channel level and the bandwidth.

FIG. 2 shows an alternative illustration of the amplification adjuster implementing a channel amplification function 200 providing respective channel amplification in dependence on the channel level 130, the bandwidth 210 and the binaural similarity 110. The channel amplification function can be implemented as a table or arithmetic function or a combination of both. In particular, a table implementation could consist of the fact that the channel level 130 is used as input parameter and the channel amplification 145 is used as output parameter. Like binaural similarity, a bandwidth would then choose between different individual tables, such that there is an individual table for each combination of bandwidth and binaural similarity, which provides unique channel amplification for an input channel level.

Figure 3:
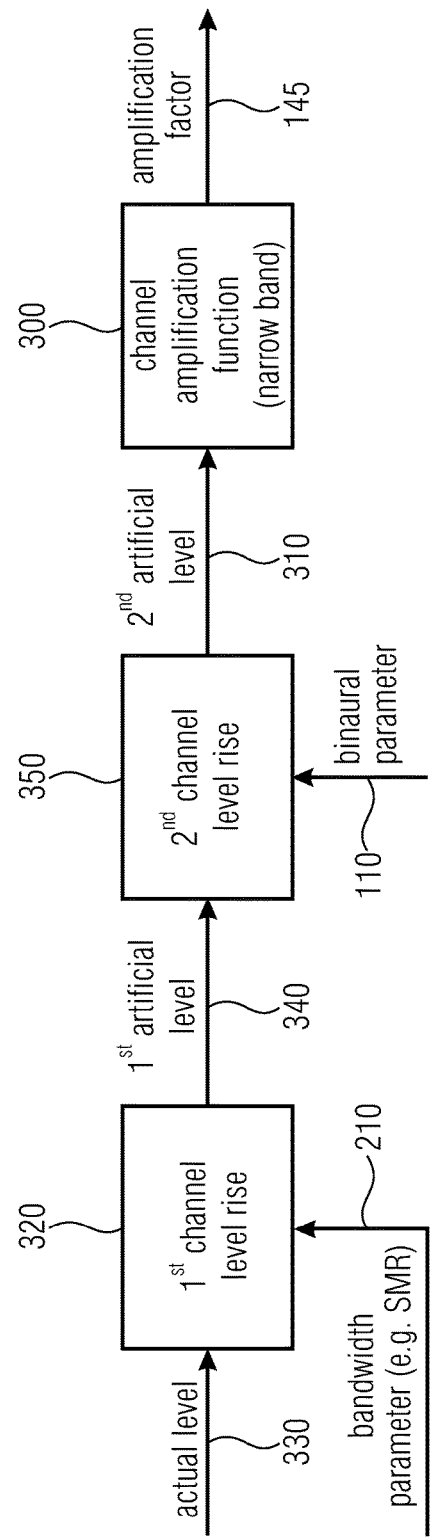
FIG. 3 is a further illustration of a channel amplification function with a fixed channel amplification function and a parameter-dependent level variation.

An alternative is illustrated in FIG. 3. Here, a narrowband channel amplification function 300 exists, that is "excited" by an input level 310 in order to provide an amplification factor 145 for a band. The input level 310 is referred to as "second artificial level" in FIG. 3. The second artificial level 310 is obtained as follows.

First, the actual level 330 and 130, respectively, is measured and fed into a first channel level increase 320. The first channel level increase 320 is controlled by a bandwidth, such as an SMR parameter 210 in order to obtain a channel level increase for broadband signals, while no channel level increase is performed for narrowband signals. In other words, relatively narrowband signals and their levels, respectively, pass through the block 320 in an unaffected manner, while the actual levels 330 for broadband signals are increased in order to obtain first artificial levels 340. Such artificial levels 340 that are dimensioned such that optimum adjustments are obtained for broadband signals by using a narrowband-adjusted channel amplification function are then fed into a second channel level increase 350 controlled by the binaural similarity 110. If a binaural signal is determined, the first artificial level 340 will be increased further to obtain the second artificial level 310, while, when the binaural similarity 110 shows that the signal is monaural, such as in a telephone conversation, the second channel level increase 350 is passed without being affected, such that in this case the second artificial level 310 is equal to the first artificial level.

Alternative implementations of different channel amplification functions for different combinations of bandwidth/binaural similarity/channel level can also be made. In one embodiment, the amplification adjuster 140 is, for example, configured to implement a level amplification value function 300 that is adjusted for monaural signals, wherein depending on the binaural similarity, the level amplification value function and channel amplification function or an input level (40, 350, 310) is modified in the level amplification value function 300.

Here, the amplification adjuster is configured to increase, depending on the binaural similarity, the input level with respect to a measured audio signal level of the left or right channel in order to eventually obtain a smaller amplification factor for the same measured level.

In an embodiment, a relatively fine-tuned audio signal analysis is performed, wherein the signal analyzer 120 performs level analysis in six or more bands, and advantageously even for all 24 Bark bands and in the Bark bands technically relevant for the hearing aid, respectively. In this implementation, the amplification adjuster 140 is configured to provide an amplification factor for each of the at least six bands and for each audio signal of the left and right audio signal. The combination signal analyzer 100 is configured to actually compare the left channel 170 and the right channel to one another, and to compare signal characteristics of the left 175 and right 185 channels, such as their short-term spectra, respectively.

Alternatively or additionally, the combination signal analyzer 100 can also be controlled by manual input 160, such that an individual wearing a hearing aid performs individual manual switching when the person speaks on the phone, for example, i.e. in a monaural situation, and switching back in a binaural situation, i.e. when the phone conversation is terminated. In other words, the binaural similarity 110 can either be obtained by audio signal analysis or by operation of the person wearing the hearing aid on the left and right ear. Alternatively or additionally, a combination of both control options can be performed by the combination signal analyzer, i.e. a signal analysis with an additional manual control option. One control option would, for example, be a small switch directly at the hearing aid or a remote control, wherein in this case, the two hearing aids are provided with a wireless or wired input interface.

Figure 6:
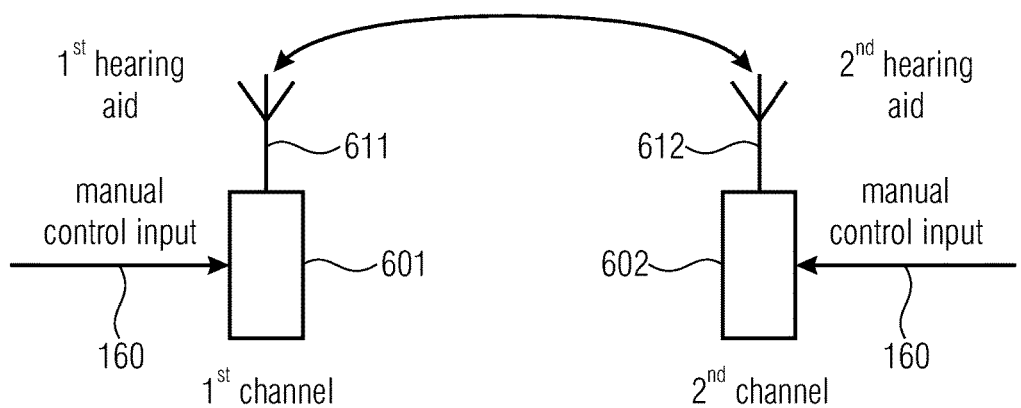
FIG. 6 is a schematic illustration of two hearing aids for the left and right channels.

In this regard, reference is made to FIG. 6, wherein FIG. 6 shows in particular a hearing aid 601 for a first channel, such as a left ear, and further a second hearing aid 602 for a second channel, such as for the right ear of an individual. The manual input option is shown as manual control input 160 in FIG. 6 for both hearing aids 601, 602. Alternatively, antennas 611, 612 are illustrated in order to indicate a wireless interface for the two hearing aids 601, 602, via which the two hearing aids can communicate. The combination signal analyzer operating, for example, based on both audio signals could then be accommodated either in the first hearing aid 601 for the first channel or in the second hearing aid 602 for the second channel in order to send the result of the binaural similarity to the respective other hearing aid. Alternatively, the combination signal analyzer could be present in both hearing aids. Then, alternatively, the combination signal analyzer could be accommodated in a third device separated from the two hearing aids, which would then communicate with the two hearing aids.

In one embodiment, the combination signal analyzer performs a spectral comparison. For this, the combination signal analyzer receives a spectrum 175 of the left audio signal 170 and a spectrum 185 of the right audio signal 180 and performs a spectral comparison. The actual comparison can, for example, be performed band-by-band in order to determine, for each band, the level difference between the left and right signal to decide, after evaluating the level differences of several bands, whether a monaural signal or a binaural signal has been examined. One option could be, for example, that when the level within one band differs by more than one threshold, such as 3 dB, dissimilarity is determined within the band. Then (dis)similarity results of the bands relevant for the signal are evaluated in that then, when the plurality of bands has provided dissimilarity results, a monaural signal is indicated. In other words, the binaural similarity would be such that a monaural signal is indicated, while when the minority of all bands has provided dissimilarity results, the binaural similarity suggests a binaural characteristic and binaural situation, respectively.

The combination signal analyzer can further be configured to perform a mixed time/frequency domain comparison operation. Here, the two hearing aids 601, 602 exchange the Bark spectrum of the current signal portion with one another in order to determine the binaurality based on the Bark spectrum or at least part of the Bark spectrum. Above that, the determination of the binaurality can be performed in a band-selective manner in that, for example, in the lower frequency domain including the first, for example, eight Bark bands, a binaural situation is determined while in the upper frequency domain above the, for example, eighth Bark band, a monaural situation is determined or vice versa. Accordingly, the amplification factor can be adjusted respectively for the respective band in order to obtain hearing aid control that is as good as possible.

Figure 5:
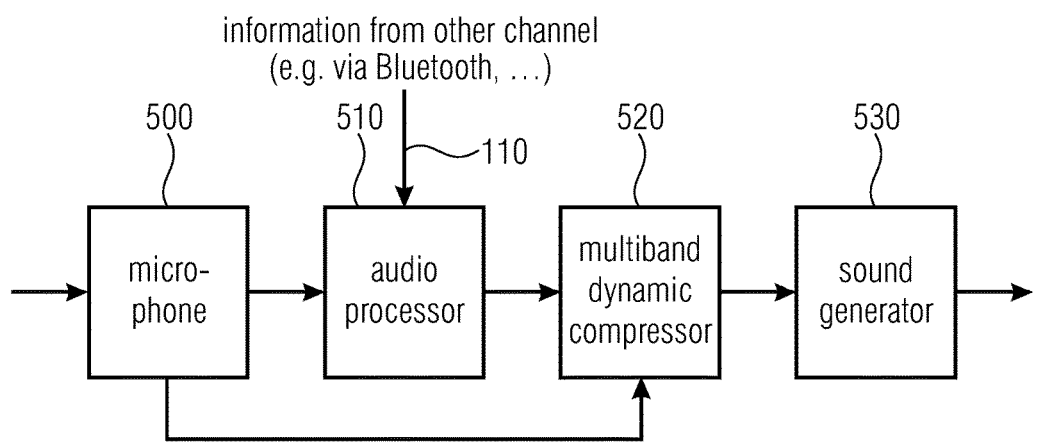
FIG. 5 is a schematic illustration of a hearing aid with microphone, audio processor, multiband dynamic compressor and sound generator.

FIG. 5 provides a schematic overview of a hearing aid having a microphone 500, an audio processor 510, a multiband dynamic compressor 520 and a sound generator 530. In this implementation, the audio processor 510 is configured to obtain information from a different channel, such as by Bluetooth or any other near-field communication.

In embodiments of the present invention, in addition to bandwidth-dependent control of the amplification, control based on binaural similarity is performed. This control is performed in real time to obtain optimum support of the individuals.

On the other hand, the inventive concept is also used for adaptation in order to adapt a hearing aid, not only by using the different procedures for narrowband and broadband signals, but also for binaural and in particular for binaural broadband signals.

Depending on the implementation, for the adaptation method, a loudness judgement of an unaided or aided measurement can be used, or the loudness judgement can also be estimated from a loudness model. Thus, the present invention can also perform selective amplification merely based on the binaural similarity, wherein no differentiation is made between narrowband and broadband signals. However, it is advantageous to perform, in addition to binaural similarity, bandwidth-controlled processing and determination of the amplification values. As stated, the adaptation of the dynamic processor can be performed with loudness sensations from unaided or also aided narrowband or advantageously broadband measurements.

Figure 4:
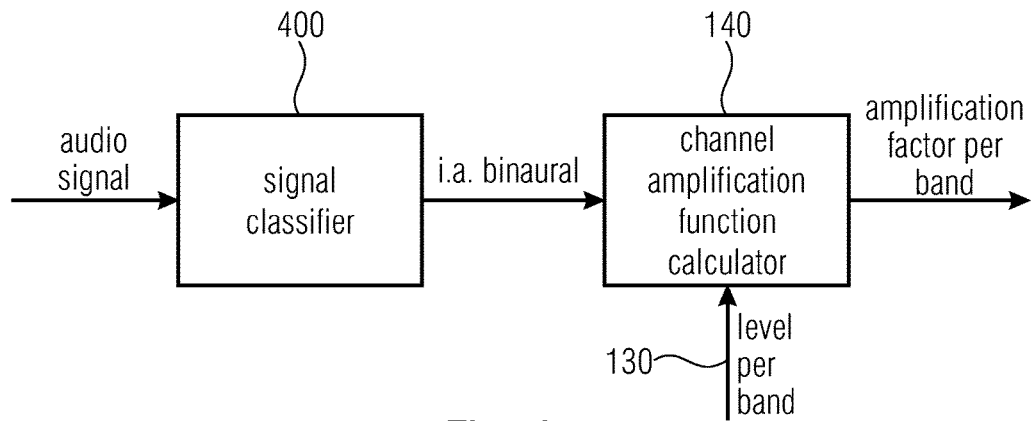
FIG. 4 is a block diagram of a binaural processor with a signal classifier and a downstream amplification adjuster and channel amplification function calculator, respectively.

Further, the present invention relates to an algorithm using, as regulation parameter for the amplification, a parameter by which signals can be classified as narrowband, broadband, monaural and binaural as illustrated in FIG. 4.

In particular, the audio signal is supplied to a signal classifier 400 providing a classification result including, among others, binaurality or monaurality, which has been discussed already with reference to the combination signal analyzer 100 of FIG. 1. The binaural similarity is then supplied to the channel amplification function calculator and amplification adjuster 140, respectively, in order to then provide an amplification factor and amplification value, respectively, per band, wherein for this, additionally, one level per band is used as also illustrated at 130 in FIG. 1. A further signal classification in addition to binaurality/monaurality is narrowband/broadband or a further classification, e.g. in speech signals or music signals which could also additionally necessitate amplification factors.

Preferably, for adjustment and adaptation, respectively, test signals are used that belong to the respective different classes of signals, i.e., narrowband/broadband, monaural/binaural test signals.

In particular, it is advantageous to use test signals generating the same channel level but differing as regards to their bandwidth, such as uniform exciting noise (UEN) having a central frequency and different Bark bandwidths. Then, the amplification for the different classes can be determined from the processed signal, such that different amplification values are obtained for the same channel levels but different classes of signals. Preferably, the dynamic compressor is adapted such that, at first, the first class of signals is adapted as regards to loudness and then, with activated processing, the other class of signals is adapted without changing the amplification values for the first class of signals.

Embodiments can be applied for the adaptation of audio dynamic compression algorithms to the individual hearing for restoring the dynamic range of a hearing-impaired person. The combination between adaptation regulation and algorithm can be used in hearing aids, but also in other audio products with hearing support, such as hearing aids in the form of headphones, headsets etc. With loudness scaling, the same provides an adaptation method that can be used in everyday clinical applications. In audio products, scaling modification can also be used in order to perform respective adaptations in uncalibrated devices.

One embodiment relates to a method for limiting the dynamic range of audio signals, wherein the dynamic range limitation is used in dependence on a regulation parameter existing at the time of regulation for differentiating between specific classes of signals, wherein the classes of signals include monaurality/binaurality and possibly include further classes of signals, such as narrowband and broadband, wherein, generally, possible intermediate stages can be used in addition to a binary yes/no decision.

After adapting the dynamic compressor to the first class of signals with the help of loudness judgements, the other class of signals is determined during activated aid for the first class of signals without changing the amplification values for the first class of signals. For regulating the amplification factor, automatic amplification regulation can be used for a dynamic limitation. Limiting the dynamic range can be performed in several frequency channels, wherein the regulating parameter can be calculated separately in all frequency channels or can be calculated by calculation regulations across the different frequency channels or can also assume the same value for all frequency channels. Depending on the implementation, categorial loudness scaling is used for judging the loudness. Depending on the implementation, the bandwidth of the signal can additionally be used as regulation parameter, in addition to the binaurality of the signal as regulation parameter. Depending on the implementation, the dynamics of the signal itself can also be used as regulation parameter wherein different onset/fade-away time constants are used. Loudness judgement can be made continuously or discontinuously with continuous signal presentation. Further, it is advantageous to perform hearing aid fitting in the free field, wherein during a further implementation hearing aid fitting is performed where the narrowband monaural loudness functions are determined via headphones and the broadband aid in the free field is performed with adjusted narrowband loudness compensation.

Figure 7:
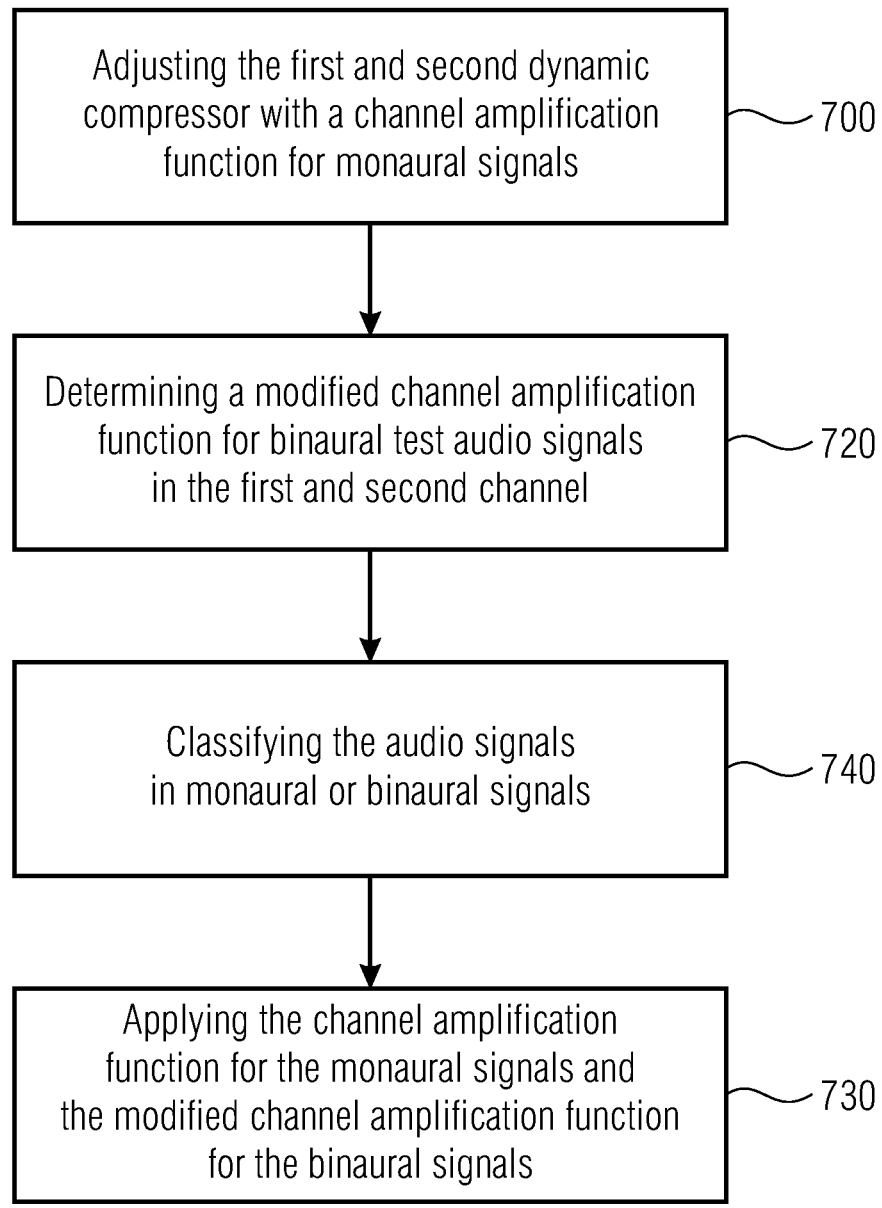
FIG. 7 is a flow diagram for illustrating a method for determining amplification values for a dynamic compressor.

FIG. 7 shows a block diagram for determining amplification values for a dynamic compressor, such as the multiband dynamic compressor 520 of FIG. 5. In step 700, the first dynamic compressor and also the second dynamic compressor is adjusted for the first and second channel, respectively, with a channel amplification function for monaural audio signals in the first and second channel. In step 720, a modified channel amplification function is determined for binaural test audio signals in the first channel and the second channel. Then, in step 730, the channel amplification function for monaural audio signals is applied and further the modified channel amplification function for binaural signals, after the audio signals have been classified in monaural or binaural signals as indicated at 740 in FIG. 7.

Figure 8:
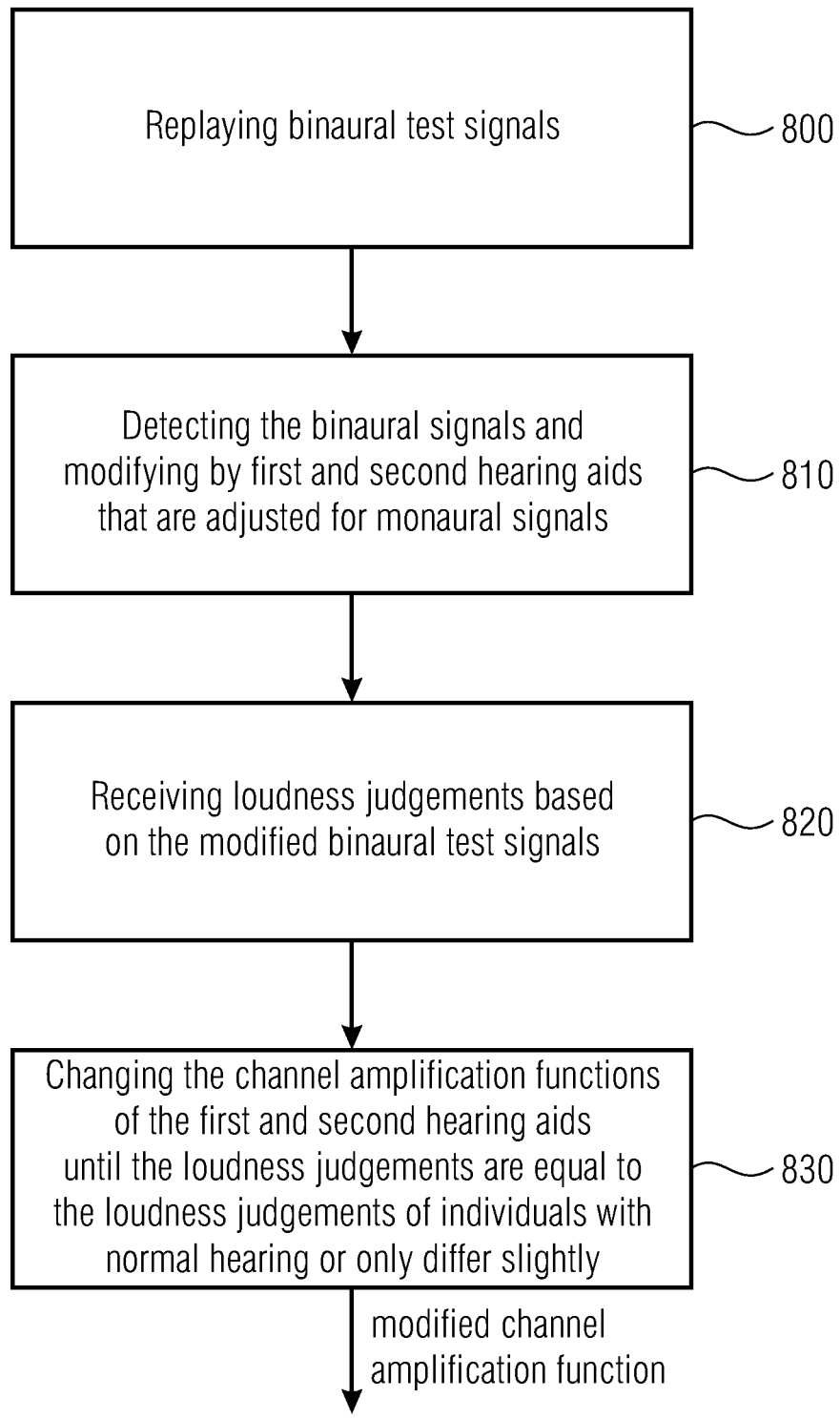
FIG. 8 is an implementation in connection with the adjustment of the amplification values for a dynamic compressor of FIG. 7.

Depending on the implementation, step 720 of determining a modified channel amplification function for binaural test audio signals in the first and second channel comprises steps shown in FIG. 8. Step 800 includes replaying binaural test signals for the first and second channels. In step 810, the binaural test signals are detected and modified by a first hearing aid for the first channel on the one hand and by a second hearing aid for a second channel on the other hand, wherein the first hearing aid and the second hearing aid are already adjusted and adapted, respectively, for monaural signals. In step 820, loudness judgements based on modified binaural test signals, i.e. the test signals already processed by the two hearing aids, are received, typically by an electric or electronic device.

Further, the step 720 of determining a modified channel amplification function for binaural test audio signals in the first and second channel includes the step of changing 830, again typically by an electric or electronic device, the channel amplification function of the first and second hearing aids until the loudness judgements are equal to loudness judgements of individuals who are not hearing-impaired or only differ slightly therefrom. This can be performed by feedback regulation with a respective target function or in the forward coupling mode. The modified channel amplification functions are, again, typically by an electric or electronic device, determined by using the received loudness judgements such that when applying the modified channel amplification function in the first hearing aid and the second hearing aid, the received loudness judgements differ by only few dB of the level from the loudness judgements of individuals who are not hearing-impaired.

In the following, different hearing tests are presented with reference to FIGS. 9a-9c. In each diagram of FIGS. 9a-9c, the total level of the signal is on the abscissa, in dB SPL, and the division of the abscissa ranges from 0 to 100 dB SPL. The loudness is plotted in CU on the ordinate, wherein CU are categorical units, i.e., subjective loudness results between "very low" (5 CU) and "too loud" (50 CU). Further, in all diagrams, the grey thick line shows persons with normal hearing, namely the average curve of persons with normal hearing (Mean MH), while the thick black line shows the average curve of hearing-impaired persons (Mean HI—average curve—hearing impaired). The thin grey lines present the curve of individual hearing-impaired persons (HI individuals), while the dotted curve shows the minimum/maximum of nine measured persons with normal hearing.

The two points connected by a horizontal line represent the difference between minimum and maximum of hearing-impaired persons (min/max HI) at "very loud" (45 CU). FIG. 9b shows the case where monaural stationary test signals have been used, both narrowband signals, such as UEN1 as well as broadband signals, such as UEN5, UEN17 or IFnoise that are represented in particular in FIG. 11 with regard to their spectrum. In particular, in FIG. 9b, amplification adaptation has been used, where the amplification values have been adjusted such that loudness compensation for narrowband signals is obtained. A good monaural adaptation for narrowband signals and in particular also for monaural broadband signals is shown. FIG. 9c shows, as a comparison, loudness judgements for binaural test signals, wherein in the left case a narrowband test signal, such as UEN1, has been used, while in the right case a broadband test signal, such as IFnoise, has been used. In narrowband test signals, a min/max distance of 19 dB is shown and an equal distribution around the average level of persons with normal hearing. For that case no or only little correction is needed. The width of the distribution of broadband signals rises to a very high value of 35 dB and is in particular shifted such that the most insensitive hearing-impaired person corresponds approximately to the average person with normal hearing. This min/max distance of 35 dB has the effect that without the present invention, a hearing-impaired person perceives signals around 35 dB as too loud compared to a person with normal hearing. Thus, according to the invention, depending on the binaural similarity, reduction of the amplification factors and in the implementation as shown in FIG. 3, artificial level increase to the second artificial level 310 is performed in order to eventually obtain lower amplification for high-level signals, in particular for broadband signals in the binaural case. The amplification factors are adapted such that the distance min/max HI in the right image of FIG. 9c becomes as small as possible, such as in the order of merely 20 dB or, even better, much smaller and the distribution is equally distributed around the average level of persons with normal hearing.

Figure 9A:
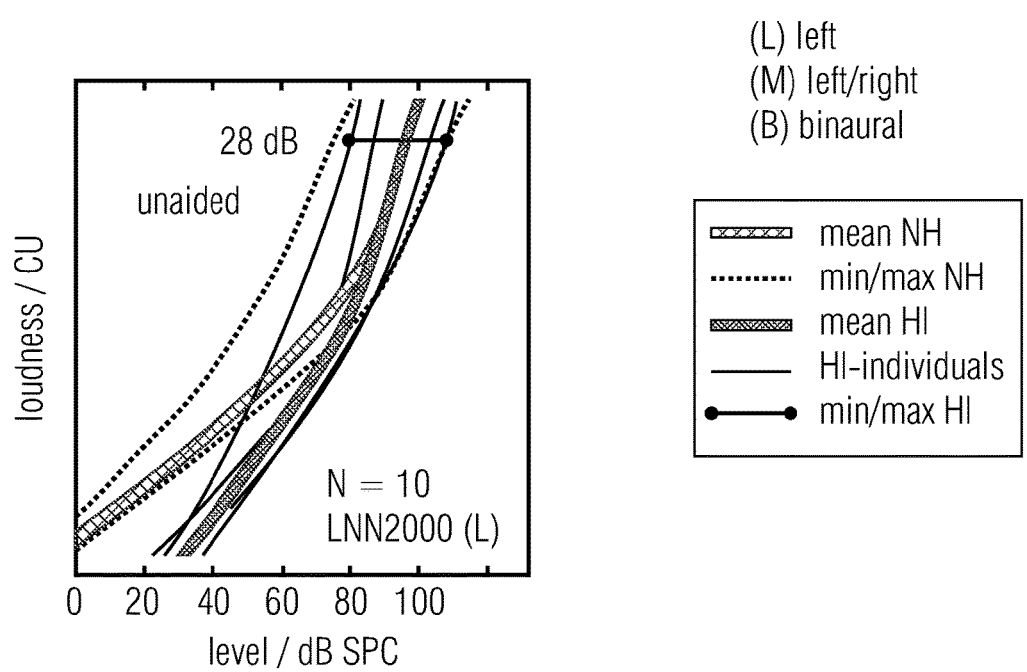
FIG. 9a is an illustration of the hearing ability of normal hearing persons compared to hearing-impaired persons.
Figure 9B:
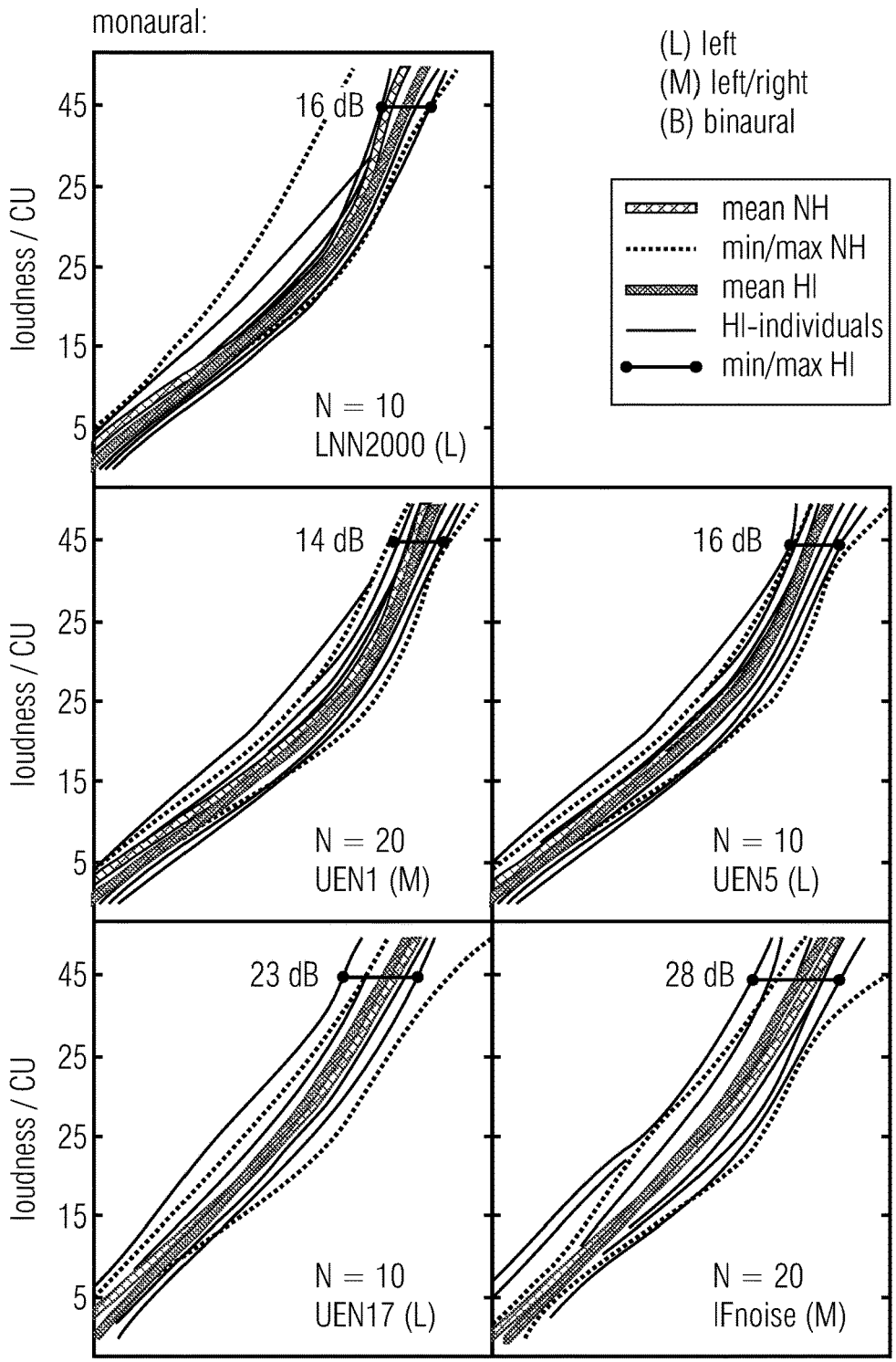
FIG. 9b is hearing curves for hearing aids adapted to monaural narrowband signals and monaural test signals.
Figure 9C:
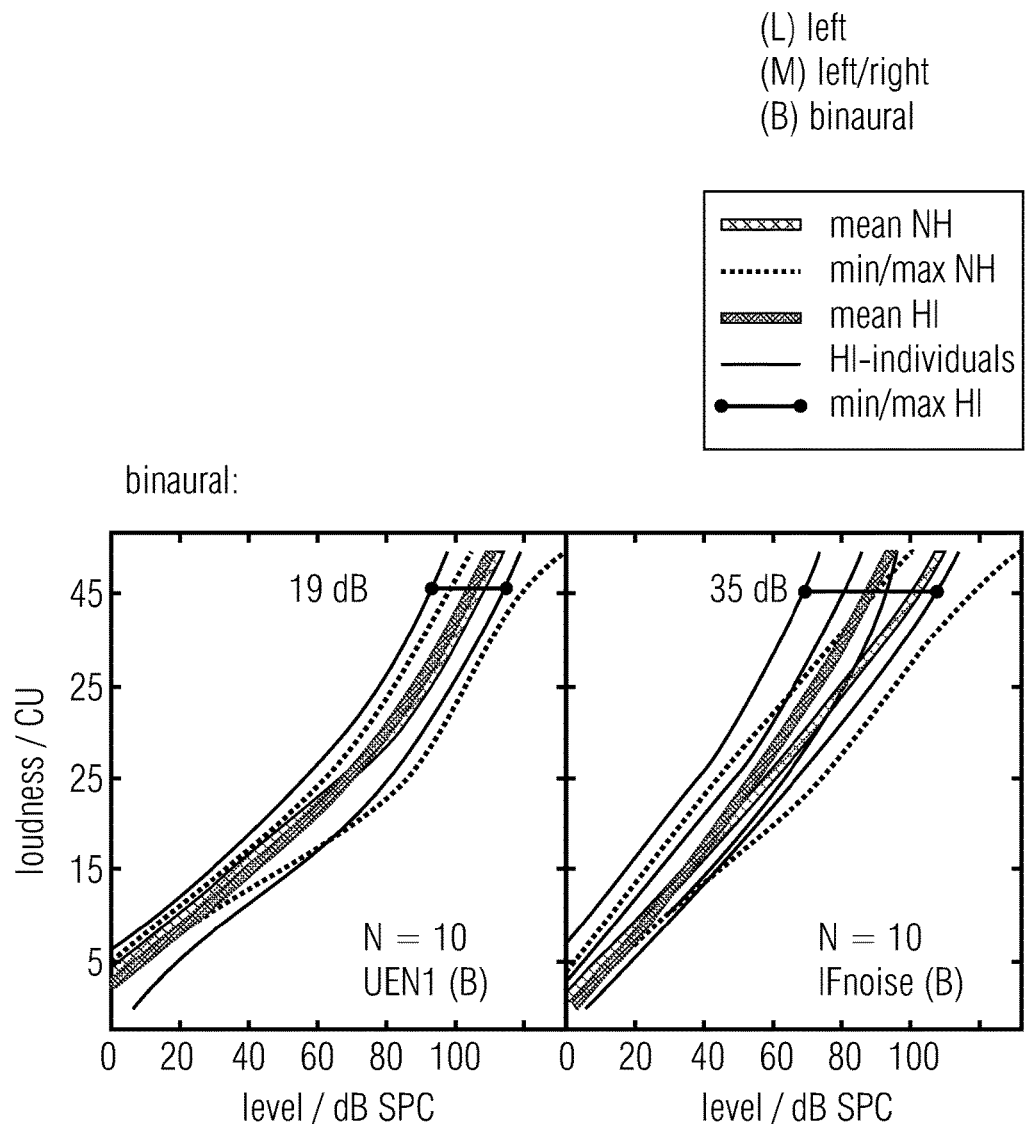
FIG. 9c is hearing curves for hearing aids adapted to monaural narrowband signals and binaural test signals.
Figure 10:
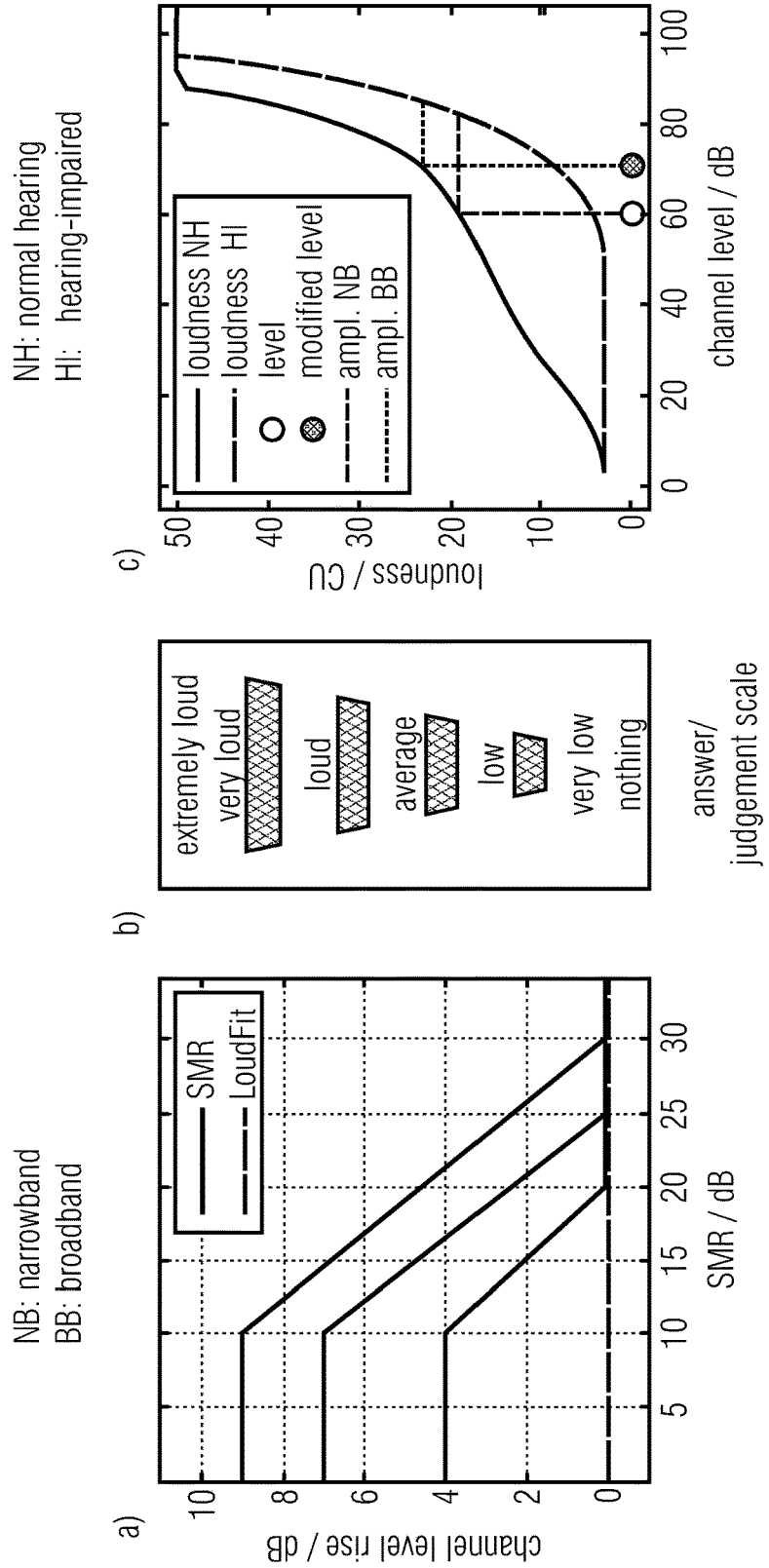
FIG. 10 is an illustration of the channel level increases for obtaining optimum adjustment for narrowband and broadband signals.

As stated, individual loudness functions for HI listeners are shown as thin grey lines in FIGS. 9a-9c. The level on the x axis corresponds to the input level in the dynamic compression algorithm. The NH loudness functions are illustrated by the thick grey line (average value) and the dotted grey lines (minimum and maximum values). The thick black line shows the average loudness function of HI listeners.

FIG. 9a shows the situation for a narrowband monaural LNN2000 signal without loudness compensation, i.e. unaided. As expected, the increased hearing thresholds of HI listeners cause a shift to the right of the loudness functions in the regions of low loudness. The result of the amplification of the LNN2000 signal according to the narrowband loudness compensation strategy as shown in FIG. 9b at the top left, results in individual loudness functions (thin grey lines) that are close to the average NH loudness function (thick grey lines). The average compensated HI loudness function (thick black line) corresponds well to the NH target (thick grey line). Similar results can be found for the narrowband UEN1 signal in the monaural (N) and the binaural (B) case. For the monaural broadband signals (UEN5, UEN17 and IFnoise), a good correspondence between the target NH loudness function and the average compensated HI loudness function can be observed. For the IFnoise signal in a binaural condition (FIG. 9c on the right), HI listeners show an average loudness function with a steeper increase over 20 CU. Here, the same loudness has been obtained at lower levels compared to the average NH listener. This shows an increased sensitivity of HI listeners for the broadband IFnoise signal in the binaural situation with a distance of 14.1 dB between the average values of both groups at 45 CU.

For reducing this increased sensitivity, the channel amplification factors are lowered when a binaural condition exists.

In embodiments of the present invention, the needed correction values for band-selective amplification are such that the normal loudness perception is restored. In particular, according to the invention, binaural loudness summation is considered, which significantly influences the loudness perception, as has been found out by the inventors. For obtaining equal loudness perception, signals provided to one ear need higher values compared to a situation where these signals are presented to both ears. For persons with normal hearing, this binaural loudness summation effect is louder for broadband signals than for narrowband signals. This effect is obviously similar for hearing-impaired persons for narrowband signals but significantly increased for broadband signals. The present invention provides a method for determining the needed amplification reduction for broadband signals following narrowband compensation. Further, the present invention allows that these amplification reduction factors can be applied independent of narrowband compensation in addition to narrowband compensation.

One embodiment of the present invention uses the average loudness functions of persons with normal hearing as target loudness function, in order to determine respective amplification values for narrowband, broadband, monaural and binaural signals. Here, the target loudness functions can also be determined or predetermined differently, e.g. the loudness functions measured for the person with normal hearing most insensitive with respect to loudness can be used, or the loudness functions can be predetermined as regards to the their position and form, in order to prevent that there are any loudness judgements above "loud" at all.

Figure 11:
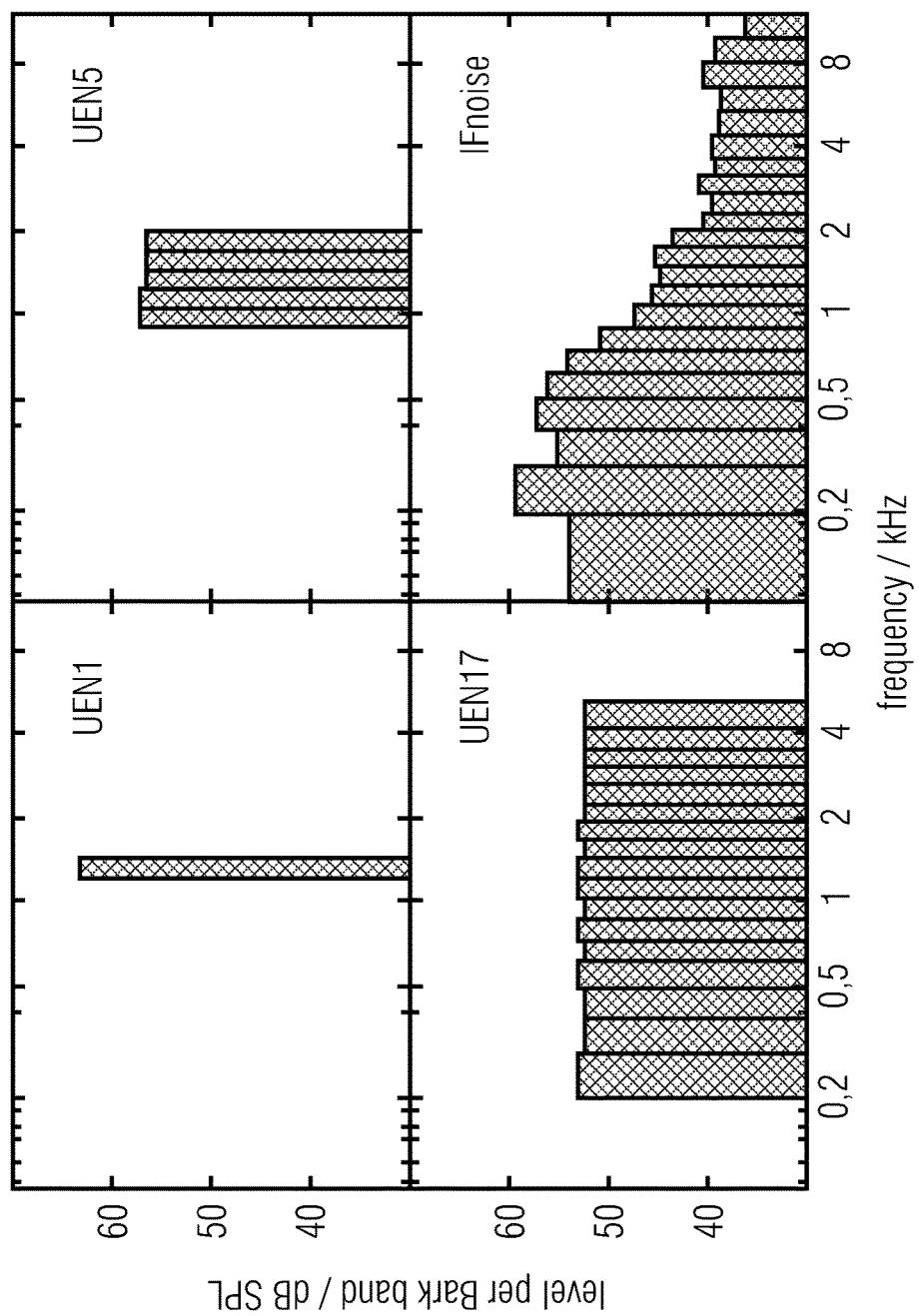
FIG. 11 is an overview of Bark spectra of different test signals, i.e. a narrowband and different broadband test signals.

FIG. 11 shows different test signals, wherein a narrowband test signal UEN1 is shown that merely occupies a single Bark band, while a first relatively low broadband signal UEN5 is shown that occupies five Bark bands. A more broadband signal UEN17 occupies 17 Bark bands and the most broadband signal IFnoise having a spectrum that is very similar to the spectrum of speech occupies the entire bandwidth, i.e. 24 Bark bands. In particular, in the shown signals, the energy of the UEN signals has been equally distributed across the Bark bands, such that the individual energy in the bands of the UEN17 signal combined results in the energy in the single band of the UEN1 signal. Further, the energy in all UEN5 bands together is equal to the energy in all UEN17 bands or the single UEN1 band. The signal IFnoise is similar to the long-term average speech spectrum for female speakers and shows a decreasing Bark spectrum.

When calculating the binaural similarity, only bands that are essential for the signal should be considered. For example, the signal UEN1 having a high level (for example 70 dB SPL on the left and right ear) is mixed with UEN17 having a lower level. The level of the UEN17 differs on the left and right ear, for example 30 dB on the left and 20 dB on the right. Then, a comparison of the bands would have the effect that a difference of 10 dB prevails in all bands, apart from the band of the UEN1, where a difference of 0 dB prevails. Since UEN1 is perceived significantly louder than UEN1, only the band of UEN1 is of essential significance for the loudness sensation, which is why high binaural similarity is determined for the signal. Alternatively, the binaural similarity could be processed for each band, such that the band of the UEN1 shows high binaural similarity, but all other bands a low binaural similarity.

According to the invention, it is ensured that hearing-impaired persons, even when aided by a monaural narrowband loudness compensation strategy, give no higher loudness judgement, since the amplification factors are reduced, in particular for broadband binaural signals. Thereby, it is considered that hearing-impaired persons also have the effect of spectral loudness summation and binaural loudness summation. Further, the convenience for a hearing-impaired person is strongly increased when broadband signals with binaural presentation are used already for diagnosing the hearing impairment and in particular also for fitting the hearing aid.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus.

Depending on certain implementation requirements, embodiments of the invention can be implemented in hardware or in software. The implementation can be performed using a digital storage medium, for example a floppy disk, a DVD, a Blu-Ray disc, a CD, an ROM, a PROM, an EPROM, an EEPROM or a FLASH memory, a hard drive or another magnetic or optical memory having electronically readable control signals stored thereon, which cooperate or are capable of cooperating with a programmable computer system such that the respective method is performed. Therefore, the digital storage medium may be computer readable. Some embodiments according to the invention include a data carrier comprising electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, wherein the computer program is stored on a machine readable carrier.

In other words, an embodiment of the inventive method is, therefore, a computer program comprising a program code for performing one of the methods described herein, when the computer program runs on a computer. A further embodiment of the inventive methods is, therefore, a data carrier (or a digital storage medium or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array, FPGA) may be used to perform some or all of the functionalities of the methods described herein. In some embodiments, a field programmable gate array may cooperate with a microprocessor in order to perform one of the methods described herein. Generally, the methods are performed by any hardware apparatus. This can be a universally applicable hardware, such as a computer processor (CPU) or hardware specific for the method, such as ASIC.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

BIBLIOGRAPHY

[1] O, Strlcyk et. al., "Restoration of loudness summation and differential loudness growth in hearing-impaired listeners", The Journal of the Acoustical Society of America, vol. 132, no. 4, pp. 2557-2568, October 2012
[2] D. Oetting et al., "Model-based loudness compensation for broad- and narrow-band signals", Proceedings of ISAAR 2013; Auditory plasticity—Listening with the brain, 2013
[3] Z. Chen, et al., "CHENFIT-AMP, A nonlinear Fitting and Amplification Strategy for Cochlear Hearing Loss", IEEE Transactions on Bio-medical Engineering, pp. 326-3237, July 2013
[4] J. Kiessling, et al., "Adaptive fitting of hearing instruments by category loudness scaling (ScalAdapt)", International Journal of Audiology, vol. 25, no. 3, pp. 153-160, 1996
[5] T. Brand, "Loudness Scaling", 8th EFAS Congress/10th Congress of the German Society of Audiology, Heidelberg: Deutsche Gesellschaft für Audiologie e. V. 2007, pp. CD-ROM

The invention claimed is:

1. Apparatus for controlling a first dynamic compressor in a first right hearing aid with a first amplification value and a second dynamic compressor in a second left hearing aid with a second amplification value, comprising:
a combination signal analyzer for determining a binaural similarity between a right audio signal and a left audio signal; and
an amplification adjuster for providing the first amplification value for the right audio signal in dependence on the binaural similarity and a level of the right audio signal and for providing the second amplification value for the left audio signal in dependence on the binaural similarity and a level of the left audio signal, wherein the amplification adjuster is configured to adjust the first amplification value for the first dynamic compressor and the second amplification value for the second dynamic compressor, at the same level and with high binaural similarity, to a respectively smaller value than in the case of low binaural similarity.

2. Apparatus according to claim 1, further comprising a signal analyzer for splitting the right audio signal and the left audio signal into a plurality of bands and for determining a level in each band, wherein the amplification adjuster is configured to provide, for each band of the right audio signal, the first amplification value in dependence on the binaural similarity and the level of the right audio signal in the band, and to provide, for each band of the left audio signal, the second amplification value in dependence on the binaural similarity and the level of the left audio signal in the band, wherein the first amplification value and the second amplification value are adjusted, at the same level in the band and high binaural similarity, to a respectively smaller value than in the case of low binaural similarity.

3. Apparatus according to claim 1,
wherein the combination signal analyzer is further configured to determine a bandwidth of the right audio signal and the left audio signal or a bandwidth of a combination of the right audio signal and the left audio signal, and
wherein the amplification adjuster is configured to further adjust the first amplification value and the second amplification value for a band in dependence on the determined bandwidth.

4. Apparatus according to claim 3,
wherein the amplification adjuster is configured to adjust the first amplification value and the second amplification value, at the same level and with high bandwidth, to a respectively smaller value than in the case of a low bandwidth.

5. Apparatus according to claim 1,
wherein the amplification adjuster is configured to implement a level amplification value function for monaural signals, and
wherein the amplification adjuster is configured to modify, depending on the binaural similarity, the level amplification value function or an input level in the level amplification value function.

6. Apparatus according to claim 5,
wherein the amplification adjuster is configured to increase, in dependence on the binaural similarity, the input level with respect to a measured audio signal level.

7. Apparatus according to claim 2, wherein the signal analyzer is configured to split the right audio signal and the left audio signal into at least six bands,
wherein the amplification adjuster is configured to provide the first amplification factor for the at least six bands of the right audio signal and to provide the second amplification factor for the at least six bands of the left audio signal.

8. Apparatus according to claim 1,
wherein the combination signal analyzer is configured to acquire a spectrum of the right audio signal and a spectrum of the left audio signal and to determine the binaural similarity by comparing the two spectra.

9. Apparatus according to claim 1,
wherein the combination signal analyzer is configured to compare levels in bands of the right audio signal and the left audio signal and to provide, by evaluating the bands essential for the right audio signal and the left audio signal, a binaural similarity of the right audio signal and the left audio signal, wherein the bands essential for the right audio signal or the left audio signal are those bands that comprise a loudness proportion of the entire right or left audio signal of more than 1 percent.

10. Apparatus according to claim 8,
wherein the combination signal analyzer is configured to determine an energy difference of corresponding bands of the spectra of the right and the left audio signal, and wherein an average value of the energy differences across the bands essential for the signal represents a value for the binaural similarity of the signals, wherein the bands essential for the right or left audio signal are those bands that comprise a loudness proportion of the entire right or left audio signal of more than 1 percent.

11. Method for controlling a first dynamic compressor in a first right hearing aid with a first amplification value and a second dynamic compressor in a second left hearing aid with a second amplification value, comprising:
determining a binaural similarity between the right audio signal and the left audio signal; and
providing a first amplification value for a band of the right audio signal in dependence on the binaural similarity and the level of the right audio signal in the band; and providing the second amplification value for the left audio signal in dependence on the binaural similarity and a level of the left audio signal, wherein the first amplification value for the first dynamic compressor and the second amplification value for the second dynamic compressor are adjusted, at the same level and with high binaural similarity, to a respectively smaller value than in the case of low binaural similarity.

12. A non-transitory digital storage medium having a computer program stored thereon to perform the method for controlling a first dynamic compressor in a first right hearing aid with a first amplification value and a second dynamic compressor in a second left hearing aid with a second amplification value, the method comprising:

determining a binaural similarity between the right audio signal and the left audio signal; and providing a first amplification value for a band of the right audio signal in dependence on the binaural similarity and the level of the right audio signal in the band; and providing the second amplification value for the left audio signal in dependence on the binaural similarity and a level of the left audio signal, wherein the first amplification value for the first dynamic compressor and the second amplification value for the second dynamic compressor are adjusted, at the same level and with high binaural similarity, to a respectively smaller value than in the case of low binaural similarity, when said computer program is run by a computer.

* * * * *